United States Patent [19]

Chenevas-Paule et al.

[11] 4,331,486
[45] May 25, 1982

[54] PROCESS FOR TREATING SEMICONDUCTOR DEVICES UNDER ATOMIC HYDROGEN PLASMA

[75] Inventors: André Chenevas-Paule, Grenoble; Vincent Le Goascoz, Claix; Pierre Viktorovitch, Grenoble, all of France

[73] Assignee: Commissariat a l'Energie Atomique, Paris, France

[21] Appl. No.: 164,544

[22] Filed: Jul. 2, 1980

[30] Foreign Application Priority Data

Jul. 6, 1979 [FR] France ............................... 79 17598

[51] Int. Cl.³ ......................................... H01L 21/263
[52] U.S. Cl. ..................................... 148/1.5; 29/585;
148/187; 250/492.2; 427/35; 427/38; 357/91
[58] Field of Search ................... 148/1.5, 187; 427/35,
427/38, 43.1; 250/492 A; 29/584; 357/91

[56] References Cited

U.S. PATENT DOCUMENTS

| 3,582,604 | 6/1971 | Bykhovsky | 219/121 PB |
|---|---|---|---|
| 3,790,411 | 2/1974 | Simms et al. | 148/1.5 |
| 4,113,514 | 9/1978 | Pankove et al. | 357/91 |
| 4,116,721 | 9/1978 | Ning et al. | 148/1.5 |
| 4,151,058 | 4/1979 | Kaplan et al. | 427/38 |
| 4,193,003 | 3/1980 | Blanchard et al. | 250/492 A |
| 4,224,084 | 9/1980 | Pankove | 148/1.5 |
| 4,239,788 | 12/1980 | Beck | 427/43.1 |
| 4,266,986 | 5/1981 | Benton et al. | 148/1.5 |

FOREIGN PATENT DOCUMENTS 2324719 2/1974 Fed. Rep. of Germany .
2601288 7/1976 Fed. Rep. of Germany .

OTHER PUBLICATIONS

Ma et al., IEEE–Jour. Solid St. Circuits, SC-13, (4), 1978, p. 445.
Ma et al., Appl. Phys. Letts., 32(7), (1978), 441.

*Primary Examiner*—Upendra Roy
*Attorney, Agent, or Firm*—Kerkam, Stowell, Kondracki & Clarke

[57] ABSTRACT

The invention relates to a process and to an apparatus for treating semiconductor devices. A hydrogen plasma is created in the vicinity of the semiconductor devices and the positively polarized plasma particles are removed therefrom. A tightly sealed enclosure is provided and contains two plane, parallel electrodes polarized so as to form an anode and a cathode. Heating means are located in the vicinity of the anode.

11 Claims, 1 Drawing Figure

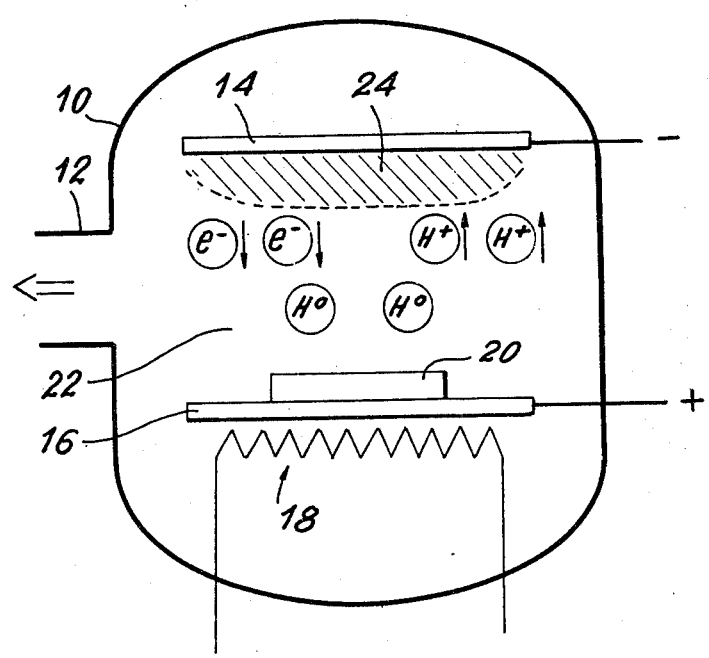

PROCESS FOR TREATING SEMICONDUCTOR DEVICES UNDER ATOMIC HYDROGEN PLASMA

BACKGROUND OF THE INVENTION

The invention relates to a process for treating semiconductor devices using the action of atomic hydrogen H° obtained by the creation of a hydrogen plasma, as well as to an apparatus for performing this process.

Generally, a semiconductor device comprises a basic semiconductor material, for example monocrystalline silicon in which are formed P+N or N+P diodes and in the case of devices having an MIS structure (metal, insulant, semiconductor) the assembly is covered by a grid insulant. The heat treatment and diffusion in the silicon necessary for forming the diodes leads to the appearance of structural defects, such as dislocations or surface or point defects in the semiconductor. In the same way, the formation of a grid insulant leads to the appearance of interface defects between the semiconductor and the insulant, as well as within the insulating layer. All these defects introduce into the semiconductor device the same number of localised levels in the forbidden band thereof. This more particularly leads to interfering transfers in jumps and significant reductions in the life of carriers in the semiconductor.

In order to eliminate the volume defects and particularly the defects at the junctions of the P+N or N+P diodes it has already been proposed (cf Appl. Phys. Lett. 32, 7, 1.4.1978, pp. 439-441, the article by J. I. PANKOVE, M. L. LAMPERT and M. L. TARNG entitled "Hydrogenation and dehydrogenation of amorphous and crystalline silicon"), to hydrogenate the semiconductor devices, e.g. by chemically reacting atomic hydrogen H° with the defects of the semiconductor device. Thus, atomic hydrogen H° can chemically bond with the defects and create covalent bond-≡Si—H, e.g. in accordance with the two following chemical reactions:

(1)

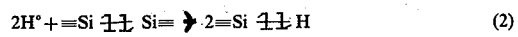

(2)

The bonding and anti-bonding levels of the covalent bonds≡Si—H obtained in this way are respectively in the valence band and the conduction band in such a way that the corresponding localized defects are then eliminated. Due to the very small diameter of the monoatomic hydrogen atoms (v≃0.5 A) the latter can penetrate by a certain depth into the network therefore of the semiconductor device, as opposed to the molecular hydrogen which has difficulty in diffusion. Thus, the elimination of the defects by such a process is not limited to the surface defects. It also applies to volume defects and particularly those at the junctions of the diodes of the semiconductor devices.

In order to effectly use such a process and due to the very unstable and reactive nature of atomic hydrogen H°, the atomic hydrogen must be created very close to the defects which are to be eliminated. For this reason, it is necessary to create a hydrogen plasma in which electrons e⁻, atoms H° and ions H⁺ are continuously formed. Therefore, hitherto choke-type systems have been used for this purpose. Such systems are constituted by a vacuum enclosure around which is wound a coil or radio frequency antenna making it possible to excite the hydrogen in the container in order to create a hydrogen plasma under an electroluminescent discharge. Such a system makes it possible to eliminate the defects of the semiconductor device placed in the enclosure, particularly at the junctions of the diodes. However, due to the geometry of the choke-type system, the H⁺ ions rotate in the magnetic field induced by the coil or by the radio frequency antenna RF. This movement of the H⁺ ions is unfavourable to the objective in question because said ions can reach and bombard the surface of the semiconductor device and can damage its network to relatively large depths, which can e.g. reach 100 Å and higher. Analysis of the curves in FIG. 1 of the article by J. A. PANKOVE, M. A. LAMPERT and M. L. TARNG referred to hereinbefore, confirms these two effects of choke-type systems. These curves show an increase in the low voltage current resulting from the ohmic regime due to the surface bombardment and improvement to the high voltage volume conduction. Thus, the use of the se known choke-type devices simultaneously leads to the elimination of defects at the junctions of diodes due to the chemical reaction of atomic hydrogen with said defects and to the creation of new defects due to the bombardment of the semiconductor device by H⁺ ions found in the hydrogen plasma with the atomic hydrogen H°.

BRIEF SUMMARY OF THE INVENTION

The present invention relates to a process for the treatment of semiconductor devices permitting the elimination by hydrogenation of volume and interface defects, for example at the junctions of diodes contained in said devices, or at the insulant-silicon interfaces, whilst obviating the creation of defects due to the bombardment of the semiconductor device by H⁺ ions contained in the plasma.

Thus, a process for treating semiconductor devices is proposed in which a hydrogen plasma is created in the vicinity of said devices, wherein means are applied which are able to remove the positively polarized particles from the said devices.

According to the invention, the hydrogen plasma is produced by means of a capacitive system having two plane, parallel electrodes polarized to form an anode and a cathode, the semiconductor device being positioned between the electrodes level with the anode.

As a result of the process of this type, the H⁺ ions in the plasma are accelerated towards the cathode, i.e. counter to the semiconductor device positioned level with the anode, in such a way that the H⁺ ions do not bombard the device as in the prior art processes using a choke system. In fact, the e⁻ electrons are directed towards the semiconductor device, but they only have a negligible action on the latter.

The invention can also be improved by the use of means able to remove the electrons from the semiconductor.

According to a preferred feature of the invention, the semiconductor device is heated to a temperature between 25° and 500° C. during the formation of the plasma, in order to aid the reaction of the monoatomic hydrogen H° with the defects.

According to another feature of the invention, the capacitive system is placed under a vacuum between 10⁻¹ and 10⁻² Torr. Preferably, the pressure value is then determined by the value of the hydrogen flow during the formation of the plasma.

According to a first variant of the invention, the electrodes are subject to a d.c. voltage close to 2 kV.

According to a second variant, the electrodes are subject to an a.c. voltage between 1.2 and 1.6 kV peak to peak and whose frequency is close to 13 MHz.

The invention also relates to an apparatus for performing the aforementioned process, wherein it comprises a sealed enclosure in which are arranged two plane, parallel electrodes polarized to form an anode and a cathode, together with heating means positioned in the vicinity of the anode.

According to another feature of the invention, a plasma is created at one point in the enclosure and the sample is treated at another point outside the plasma. This is possible due to the diffusion of atomic hydrogen H° throughout the enclosure.

DESCRIPTION OF THE DRAWING AND PREFERRED EMBODIMENTS

An embodiment of the invention is described hereinafter in non-limitative manner with reference to the single drawing which diagrammatically shows an apparatus for the hydrogenation treatment of semiconductor devices having defects, such as dislocations.

The apparatus shown in the drawing comprises a tightly sealed enclosure 10 connected to a not shown pumping system by one or more pipes 12. Enclosure 10 contains two electrodes 14 and 16 polarized in an appropriate manner to constitute respectively a cathode and an anode. According to the invention, electrodes 14 and 16 are plane and parallel so as to define a capacitive system. As an example, the diameter of electrodes 14 and 16 can be approximately 100 mm.

In order to aid the chemical reaction of the atomic hydrogen with the defects of the semiconductor device to be treated, a heating device 18, such as an oven is positioned in the vicinity of anode 16 to which is fixed the semiconductor device 20 between electrodes 14 and 16.

The processing or treatment device described hereinbefore with reference to the drawing operates in the following way.

Initially, within enclosure 10 a vacuum of approximately $10^{-7}$ Torr is produced. The hydrogen introduced into the enclosure 10 brings the pressure to between $10^{-1}$ and $10^{-2}$ Torr and it is then "decomposed" by applying an appropriate voltage between electrodes 14 and 16. According to a first variant, the thus applied voltage is a d.c. voltage, preferably close to 2 kV. According to the second variant, the voltage between the electrodes 14 and 16 is a high frequency a.c. voltage between 1.2 and 1.6 kV peak to peak and whose frequency, in the RF radio frequency range, is close to 13 mHz (e.g. 13.56 MHz).

As a result of the voltage applied between electrodes 14 and 16, the hydrogen in enclosure 10 is excited under an electroluminescent discharge and is converted into a luminescent plasma 22, with the exception of a dark space 24, called the Crookes dark space, formed close to cathode 14. Plasma 22 contains neutral monoatomic hydrogen H°, H+ ions and e− electrons. The pressure in enclosure 10 is regulated as a function of the hydrogen flow to reach for example a value of $2 \times 10^{-1}$ Torr in the absence of a discharge in $5 \times 10^{-2}$ Torr in the presence of a discharge.

The constitution of plasma 22 is the same, no matter what type of voltage is applied to electrodes 14 and 16, although the e− electrons follow the high frequency when this voltage is an a.c. voltage. In all cases, the H+ ions are accelerated towards cathode 14 and e− electrons are accelerated towards the semiconductor device 20, illustrated in the drawing. However, the neutral monoatomic hydrogen H° is insensitive to the electric field. Throughout the volume of plasma 22 and therefore close to the semiconductor device 20 hydrogen atoms H° are continuously produced and eliminated in accordance with the two following reactions:

Due to their small diameter, the thus created hydrogen atoms H° can penetrate the network of semiconductor 20 and react with different defects of the latter in accordance with the aforementioned reactions (1) and (2).

Thus, the corresponding localized defects are eliminated. In order to facilitate this operation simultaneously with the creation of the plasma, it is necessary to heat the semiconductor device 20 by means of oven 18 to a temperature chosen as a function of the nature of the treated semiconductor, said temperature being generally between 25° and 500° C.

Due to the relative arrangement and shape of electrodes 14 and 16 and due to the positioning of semiconductor device 20 level with anode 16, the H+ produced in the plasma are accelerated towards cathode 14, moving away and consequently not bombarding the device 20. Thus, the protons created in the hydrogen plasma do not cause defects in device 20. Although the electrons produced in the plasma bombard the semiconductor device 20, the effect of said bombardment can be considered negligible due to their very reduced mass.

Furthermore, it is also possible to reduce or eliminate it by using means able to remove electrons from device 20, particularly a magnetic field.

Obviously, the treatment process and the apparatus for performing this process described hereinbefore can be used for treating different types of semiconductor devices, provided that they have surface bonds and volume defects enabling the monoatomic hydrogen produced in the plasma to react with the corresponding defects.

Moreover, the invention is not limited to the construction of an apparatus of the "capacitive" type. Any apparatus able to create a hydrogen plasma and to remove the H+ ions produced from the device to be treated is suitable (particularly by the polarization of the devices relative to the plasma or by arranging the devices outside the interelectrode space in the vicinity of the plasma).

What is claimed is:

1. A process for treating semiconductor devices comprising the steps of producing a hydrogen plasma in the vicinity of said devices, and further the step of removing the positively polarized particles of the plasma from said devices.

2. A process according to claim 1, further including the steps of producing a hydrogen plasma by means of a capacitive system having two plane, parallel electrodes polarized so as to form an anode and a cathode, and positioning the semiconductor device between the electrodes level with the anode.

3. A process for treating semiconductor devices, wherein said process comprises the steps of producing a hydrogen plasma in the vicinity of said devices, of removing the positively polarized particles of the plasma from said devices, and of heating the semiconductor device to a temperature between 25° and 500° C. during the production of the plasma.

4. A process according to claim 3, wherein said process comprises producing a hydrogen plasma by means of a capacitive system having two plane, parallel electrodes polarized so as to form an anode and a cathode, the semiconductor device being positioned between the electrodes level with the anode.

5. A process according to claim 4, wherein the electrodes are subject to a d.c. voltage close to 2 kV.

6. A process according to claim 4, wherein the electrodes are subject to an a.c. voltage between 1.2 and 1.6 kV. peak to peak and whose frequency is close to 13 mHz.

7. A process for treating semiconductor devices, wherein said process comprises the steps of producing a hydrogen plasma in the vicinity of said devices, of removing the positively polarized particles of the plasma from said devices, and of placing the semiconductor device under a vacuum between $10^{-1}$ and $10^{-2}$ Torr.

8. A process according to claim 7, wherein the pressure value is determined by the hydrogen flow value during the production of the plasma.

9. A process according to claim 7 or claim 8, wherein said process further comprises producing a hydrogen plasma by means of a capacitive system having two plane, parallel electrodes polarized so as to form an anode and a cathode, the semiconductor device being positioned between the electrodes level with the anode.

10. A process according to claim 9, wherein the electrodes are subject to a d.c. voltage close to 2 kV.

11. A process according to claim 9, wherein the electrodes are subject to an a.c. voltage between 1.2 and 1.6 kV. peak to peak and whose frequency is close to 13 mHz.

* * * * *